(12) United States Patent
Komoto

(10) Patent No.: US 7,050,477 B2
(45) Date of Patent: May 23, 2006

(54) SEMICONDUCTOR LASER APPARATUS

(75) Inventor: Satoshi Komoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 10/395,828

(22) Filed: Mar. 24, 2003

(65) Prior Publication Data

US 2003/0231672 A1  Dec. 18, 2003

(30) Foreign Application Priority Data

Mar. 28, 2002  (JP) ............................. 2002-091521

(51) Int. Cl.
*H01S 3/08* (2006.01)
(52) U.S. Cl. .................................... 372/107; 372/50.01
(58) Field of Classification Search .................. 372/34, 372/43, 45, 75, 51, 54, 55, 59
See application file for complete search history.

(56) References Cited

U.S. PATENT DOCUMENTS 5,307,362 A * 4/1994 Tanaka et al. ................ 372/50
5,309,460 A * 5/1994 Fujimaki et al. ............... 372/36
5,485,479 A * 1/1996 Kitamura et al. ............. 372/43
5,727,009 A * 3/1998 Tajiri et al. .................... 372/43
6,181,720 B1 * 1/2001 Kanemoto et al. ............ 372/43
D489,695 S     5/2004 Komoto

FOREIGN PATENT DOCUMENTS

| JP | 2000-357839 | 12/2000 |
| JP | 2002-033544 | * 1/2002 |
| WO | 02/07275 | 1/2002 |

OTHER PUBLICATIONS

U.S. Appl. No. 10/200,048, filed Jul. 18, 2002, Komoto.

* cited by examiner

*Primary Examiner*—Minsun Oh Harvey
*Assistant Examiner*—Tuan N. Nguyen
(74) *Attorney, Agent, or Firm*—Hogan & Hartson, L.L.P.

(57) ABSTRACT

A semiconductor laser apparatus includes a semiconductor laser element, a lead frame on which the semiconductor laser element is mounted, and an enclosure attached to the lead frame. When a direction in which a main beam is emitted from the semiconductor laser element is defined as forward, the lead frame has a reference surface serving as a reference for the semiconductor laser element in a forward or backward direction of the main beam, behind a portion where the semiconductor element is mounted.

22 Claims, 4 Drawing Sheets

SEMICONDUCTOR LASER APPARATUS

CROSS REFERENCE TO RELATED APPLICATION

This application is based upon and claims benefit of priority under 35 USC 119 from the Japanese Patent Application No. 2002-91521, filed on Mar. 28, 2002, the entire contents of which are incorporated herein by reference.

BACKGROUND OF THE INVENTION

The present invention relates to a semiconductor laser apparatus.

Recently, a semiconductor laser apparatus which irradiates the surface of an optical disk with a laser beam is widely used in a DVD (Digital Versatile Disc) system and the like. FIGS. 4A to 4C illustrate the arrangement of a conventional semiconductor laser apparatus. FIG. 4A is a plan view showing the apparatus. FIG. 4B is a longitudinal sectional view taken along a line C—C in FIG. 4A. FIG. 4C is a left side view.

A semiconductor laser element 103 is mounted on a substrate 105 which is made of silicon or the like and on which a semiconductor laser element mounting bed and a light receiving element 104 are formed. This semiconductor laser element 103 emits a main laser beam 108 forward (to the left in FIG. 4A), and emits a monitoring beam 109 backward. The light receiving element 104 formed in the surface of the substrate 105 receives this monitoring beam 109.

The semiconductor laser element 103 is connected to a lead frame 101 by a bonding wire 107a. The light receiving element 104 is connected to a lead 101a separated from the lead frame 101 by a bonding wire 107b. The substrate 105 is connected to a lead 101b by a bonding wire 107c.

In addition, an enclosure 102 made of a material such as resin is formed on the lead frame 101 so as to surround the rear portion and two side portions of the semiconductor laser element 103. An enclosure 102a is formed on the lower surface of the lead frame 101.

This semiconductor laser apparatus is installed in a hole formed in a holder of a pickup head (not shown). In this installation, a front section 201 of the lead frame 101 functions as a reference surface for positioning in the forward or backward direction of the main laser beam 108 (in the horizontal direction in FIG. 4A), and side sections 202 function as reference surfaces for positioning in the lateral direction (in the vertical direction in FIG. 4A).

Unfortunately, the above apparatus has the following problem. When the semiconductor laser apparatus is installed in the holder of the pickup head, the relative positional relationship between the semiconductor laser element 103 and the holder is important. That is, the front section 201 as the reference in the forward or backward direction of the main laser beam 108 and the semiconductor laser element 103 are in substantially the same position as shown in FIG. 4A. Therefore, the relative positional relationship between them is unconditionally determined, so the degree of freedom of design is very low. This degree of freedom of design may be increased by moving the semiconductor laser element 103 backward (to the right in FIG. 4A) as needed. However, this increases the dimension in the forward or backward direction of the entire apparatus and hence increases the size of the apparatus, so it is undesirable to use this method.

SUMMARY OF THE INVENTION

According to one aspect of the invention, a semiconductor laser apparatus comprises a semiconductor laser element, a lead frame on which the semiconductor laser element is mounted, and an enclosure attached to the lead frame, wherein when a direction in which a main beam is emitted from the semiconductor laser element is defined as forward, the lead frame has a reference surface serving as a reference for the semiconductor laser element in a forward or backward direction of the main beam, behind a portion where the semiconductor element is mounted.

According to another aspect of the invention, a semiconductor laser apparatus includes a semiconductor laser element, a lead frame on which the semiconductor laser element is mounted, an enclosure attached to the lead frame, and a heat sink attached to the enclosure to radiate heat generated by the semiconductor laser element, wherein when a direction in which a main beam is emitted from the semiconductor laser element is defined as forward, the heat sink has a reference surface serving as a reference for the semiconductor laser element in the forward or backward direction of the main beam, and, when a direction perpendicular to the forward or backward direction of the main beam and parallel to a surface of said lead frame on which said semiconductor laser element is mounted is defined as a lateral direction, the heat sink has a reference surface serving as a reference for the semiconductor laser element in the lateral direction.

DESCRIPTION OF THE PREFERRED EMBODIMENTS

Embodiments of the present invention will be described below with reference to the accompanying drawings.

(1) First Embodiment

Figure 1A:
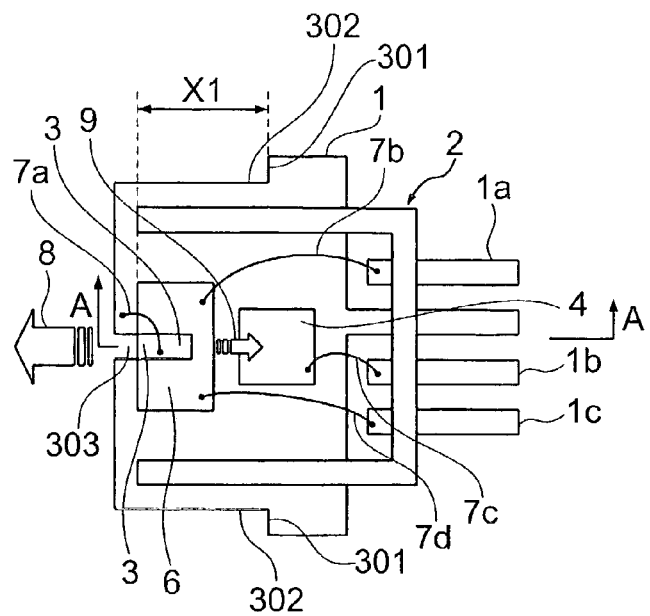
FIGS. 1A, 1B, and 1C are a plan view, longitudinal sectional view, and side view, respectively, showing the arrangement of a semiconductor laser apparatus according to the first embodiment of the present invention.
Figure 1B:
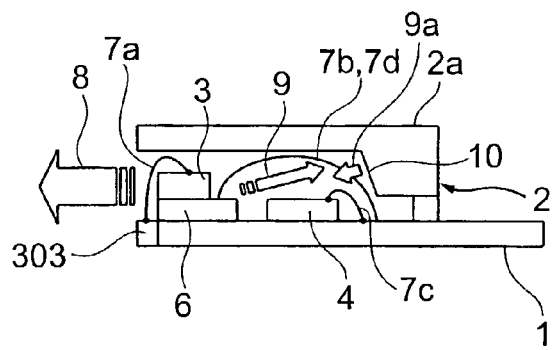
Figure 1C:
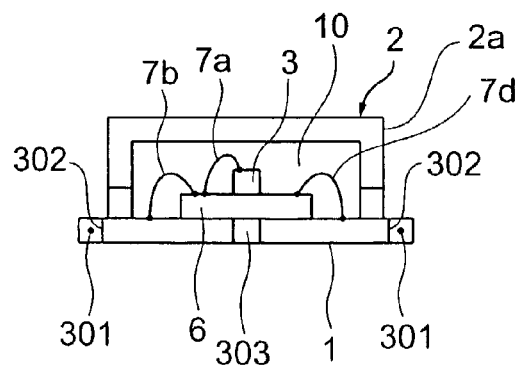

FIGS. 1A, 1B, and 1C illustrate the arrangement of a semiconductor laser apparatus according to the first embodiment of the present invention. FIG. 1A is a plan view showing the state in which a cover 2a of an enclosure 2 of this apparatus is removed. FIG. 1B is a longitudinal sectional view taken along a line A—A in FIG. 1A. FIG. 1C is a side sectional view.

A semiconductor laser element 3 is mounted on a substrate 6 made of a material such as ceramic, and this substrate 6 and a semiconductor substrate 4 are mounted on a lead frame 1. The semiconductor laser element 3 emits a main laser beam 8 forward (to the left in FIG. 1A), and also emits a monitoring beam 9 backward. A light receiving element (not shown) is formed in the surface of the semiconductor substrate 4. This light receiving element receives a reflected beam 9a formed when the monitoring beam 9 is reflected by a light reflecting surface 10 formed on the cover 2a of the enclosure 2.

The semiconductor laser element 3 is connected to the lead frame 1 by a bonding wire 7a. The light receiving element is connected to a lead 1b separated from the lead frame 1 by a bonding wire 7c. The substrate 6 is connected to a lead 1a by a bonding wire 7b, and to a lead 1c by a bonding wire 7d.

The enclosure 2 made of a material such as resin is placed on the lead frame 1 so as to surround the rear portion, two side surfaces, and upper surface, except for the front portion, of the semiconductor laser element 3 mounted on the lead frame 1.

This semiconductor laser apparatus is installed in a hole formed in a holder of a pickup head (not shown). In this installation, assuming that a direction in which the main beam 8 is emitted from the semiconductor laser element 3 is forward, front sections 301 of notches formed in the lead frame 1 function as reference surfaces for positioning in the forward or backward direction of the main beam 8 (in the horizontal direction in FIG. 1A). Also, assuming that a direction perpendicular to the longitudinal direction and parallel to that surface of the lead frame 1, on which the semiconductor laser element 3 is mounted is the lateral direction, side sections 302 function as reference surfaces for positioning in this lateral direction (in the vertical direction in FIG. 1A). In addition, assuming that a direction perpendicular to that surface of the lead frame 1, on which the semiconductor laser element 3 is mounted is the vertical direction, and that this surface on which the semiconductor laser element 3 is mounted is the top surface of the lead frame 1, the bottom surface of the lead frame 1 is a reference surface in the vertical direction.

In this embodiment as described above, the front sections 301 as the references in the forward or backward direction are positioned after (to the right in FIG. 1A) the semiconductor laser element 3. A relative distance X1 between the front sections 301 and the semiconductor laser element 3 can be set to a desired value. This greatly improves the degree of freedom of design pertaining to the relative distance between the holder and the semiconductor laser element 3 when the semiconductor laser apparatus is installed in the holder. Also, the bottom surface of the lead frame 1 is the reference surface in the vertical direction. This realizes installation with higher accuracy than when the apparatus shown in FIGS. 4A to 4C in which the bottom surface of the lead frame is covered with an enclosure is installed.

A procedure of fabricating this apparatus will be explained below. First, on a lead frame 1 pressed and molded into a desired pattern, a resin serving as an enclosure 2 is formed by injection molding so as to surround a portion where a semiconductor laser element 3 is to be mounted. The material of the lead frame 1 is, e.g., a copper-based material in order to improve the heat radiation properties in operation. However, it is sometimes also possible to use an iron-based material such as a 42 alloy. To improve the ease of assembly, appropriate plating such as gold, nickel, or palladium plating can be formed on the lead frame 1 in advance.

Next, a semiconductor substrate 4 in which a light receiving element is formed and a substrate 6 on which the semiconductor laser element 3 is mounted are mounted on the molded lead frame 1. The substrate 6 is made of, e.g., a ceramic material of aluminum nitride having a thermal expansion coefficient close to that of the semiconductor laser element 3, and having thermal conductivity higher than that of silicon. An electrode is formed on the surface of this substrate 6 beforehand by depositing and patterning an electrode material such as gold.

When the semiconductor substrate 4 and substrate 6 are mounted on the lead frame 1, conduction is ensured by adhering an adhesive such as gold-tin solder by melting it at a temperature of about 300° C. Alternatively, a silver epoxy adhesive or the like can be used instead of the solder.

The bottom surface of the lead frame 1 is not covered with the enclosure 2 but exposed, in order to improve the heat radiation properties when the adhesive is heated or the apparatus is installed in the holder. The lead frame 1 is desirably exposed particularly in that portion of the lead frame 1, which corresponds to a portion where the semiconductor laser element 3 or the light receiving element of the semiconductor substrate 4 is mounted on the opposite side of this lead frame 1.

Figure 4A:
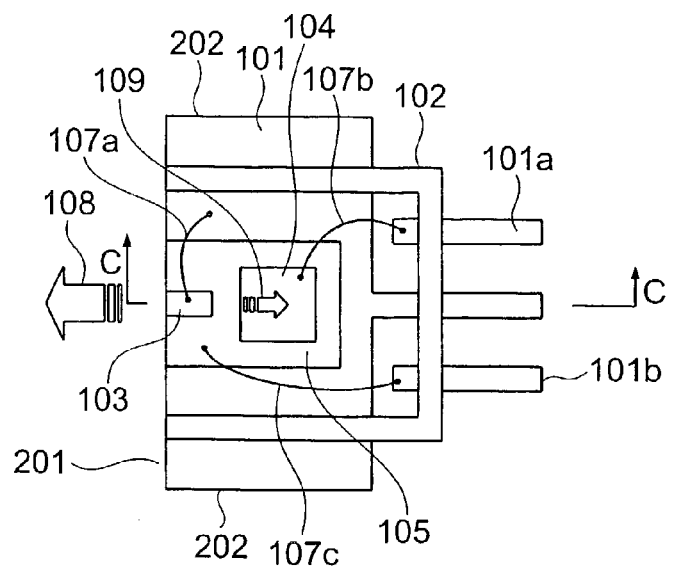
FIGS. 4A, 4B, and 4C are a plan view, longitudinal sectional view, and side view, respectively, showing the arrangement of a conventional semiconductor laser apparatus.
Figure 4B:
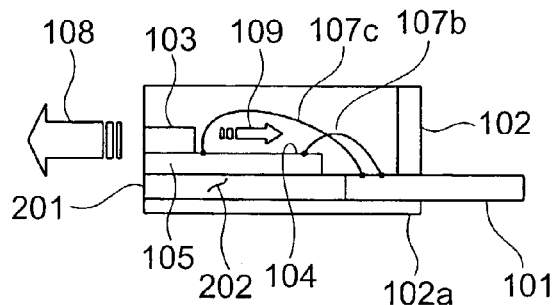
Figure 4C:
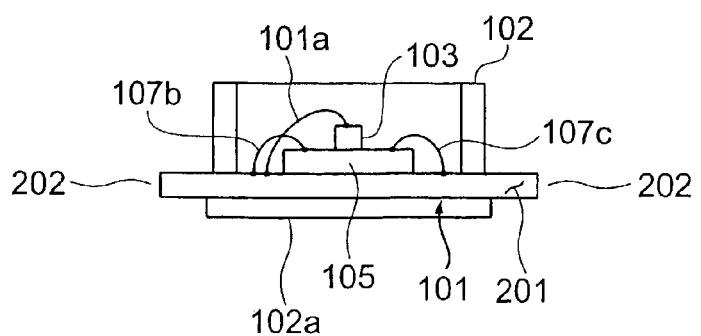

The apparatus shown in FIGS. 4A to 4C has no good heat radiation properties, since the bottom surface of the lead frame 101 is covered with the portion 102a of the enclosure 102. By contrast, in the apparatus of this embodiment, the bottom surface of the lead frame 1 is not covered with the enclosure 2 but exposed. Accordingly, when this apparatus is installed in a holder of a pickup head, the bottom surface of the lead frame 1 is in direct contact with the holder. This improves the heat radiation properties because heat generated from the semiconductor laser element 3 is radiated to the outside via the lead frame 1 and holder.

On the top surface of the lead frame 1, the light receiving element formed in the surface of the semiconductor substrate 4 is mounted on a plane parallel to the semiconductor laser element 3. This is to improve the workability and productivity in a series of steps such as a hoop line in which the lead frame flows. The semiconductor laser element 3 and semiconductor substrate 4 are adhered by heat onto this molded lead frame 1. Since this heating process is performed, a material such as heat-resistant engineering plastic (e.g., PPA) or a liquid crystal polymer is used as the enclosure 2. The enclosure 2 can also be made of a material such as PSF, PES, PPS, PEEK, PAR, PAI, PEI, PI, or FR (PTFE). However, it is favorable to totally take account of, e.g., the heat resistance, chemical resistance, mechanical strength, lead adhesion, moldability, outgas, and cost. Therefore, PPA is used in this embodiment.

To make electrical connections, the semiconductor laser element 3, semiconductor substrate 4, and substrate 6 are connected to the lead frame 1 or leads 1a to 1c by bonding wires 7a to 7d.

To downsize the apparatus, the bonding space on the lead frame 1 is considerably limited. Especially in the apparatus of this embodiment which includes the two-wavelength semiconductor laser element 3 which emits two different wavelengths, the number of bonding wires increases accordingly, so it is important to ensure the bonding space. In particular, one end of the wire 7a having the other end connected to the semiconductor laser element 3 must be bonded onto the lead frame 1 such that this wire 7a is not brought into contact with the substrate 6. However, if the loop of the wire is bent midway along the wire, the assembly yield and assembly speed lower. Therefore, in this embodiment as shown in FIGS. 1A and 1B, a bonding space for connecting the other end of the wire 7a is formed before the mounting position of the substrate 6 on the lead frame 1.

This makes it possible to shorten the loop of the wire 7a and form this wire 7a into a relatively linear simple shape, thereby improving the ease of assembly.

On the other hand, the laser beam emission point of the semiconductor laser element 3 is positioned after (to the right in FIGS. 1A and 1B) the front end portion of the lead frame 1. Accordingly, to prevent adverse effects such as interference caused if the laser beam is intercepted by the front end portion of the lead frame 1, a window 303 is formed by notching a portion of the lead frame 1 before the region where the semiconductor laser element 3 is mounted, thereby preventing inconvenience.

The semiconductor laser element 3 and semiconductor substrate 4 can be placed on the lead frame 1 by using the window 303 as a reference when the semiconductor laser element 3 is mounted. Especially when a plurality of laser beams are emitted from one semiconductor laser element 3 as in this embodiment, the semiconductor laser element 3 must be placed in alignment with the electrode pattern on the substrate 6. Therefore, the substrate 6 must be accurately placed on the lead frame 1, so confirmation of the mounting position is important.

After the apparatus is completely assembled as described above, a cover 2a is accurately adhered to the body of the enclosure 2 by an adhesive or by hot welding, ultrasonic welding, press fit, fitting, or the like. For example, the adhesion surface is coated with a silicone-based adhesive, and the cover 2a is attached to the enclosure 2 and adhered by curing the adhesive at about 200° C. As described above, the light reflecting surface 10 is formed on a portion of the inner surface of this cover 2a, so the monitoring beam 9 emitted backward from the semiconductor laser element 3 is reflected and fed into the light receiving element. Accordingly, the material and surface treatment of the cover 2a must be so selected as to increase the light reflectance of this light reflecting surface 10.

In this embodiment, PPA is used as the material of this cover 2a similar to the body of the enclosure 2, by taking not only an adhesive but also ultrasonic welding or hot welding into consideration. As another material, plated PBT, metal, or resin can also be used as the cover 2a. Similar to the lead frame 1, a notch can also be formed in the top surface of the cover 2a so as not to intercept the main laser beam 8 from the semiconductor laser element 3.

Alternatively, a method so-called hot caulking can also be used. That is, one or a plurality of projections are formed on the body of the enclosure 2, and holes corresponding to these projections are formed in the cover 2a. After fitting, the tips of the projections are crushed with heat and pressure, thereby fixing the cover 2a to the body of the enclosure 2.

This method will be explained with reference to FIGS. 2A to 2C.

Figure 2A:
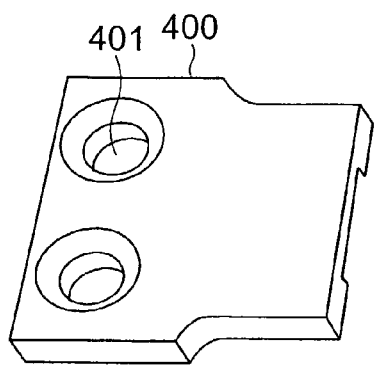
FIGS. 2A, 2B, and 2C are perspective views showing a method of attaching a cover to an enclosure by hot caulking in the semiconductor laser apparatus in order of steps.
Figure 2B:
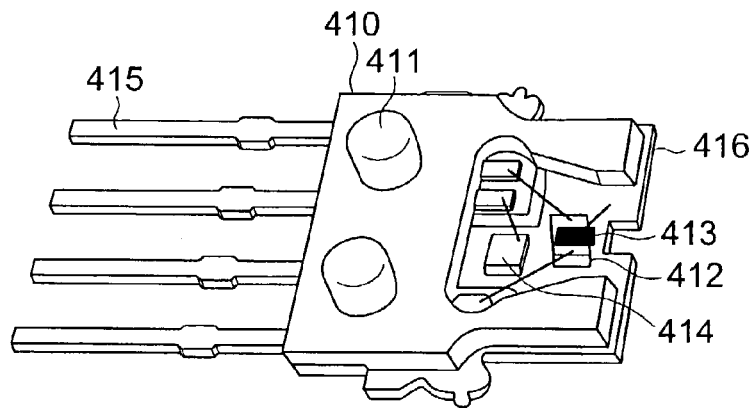

As shown in FIG. 2A, holes 401 are formed in a cover 400. As shown in FIG. 2B, projections 411 are formed on the surface of an enclosure 410. A substrate 412 is mounted on a lead frame 416 which is connected to leads 415 by wires (not shown), and a semiconductor element for emitting a laser beam is mounted on the surface of this substrate 412. The laser beam is received by a light receiving element formed in a semiconductor substrate 414. The enclosure 410 is formed in the surface of the lead frame 416.

Figure 2C:
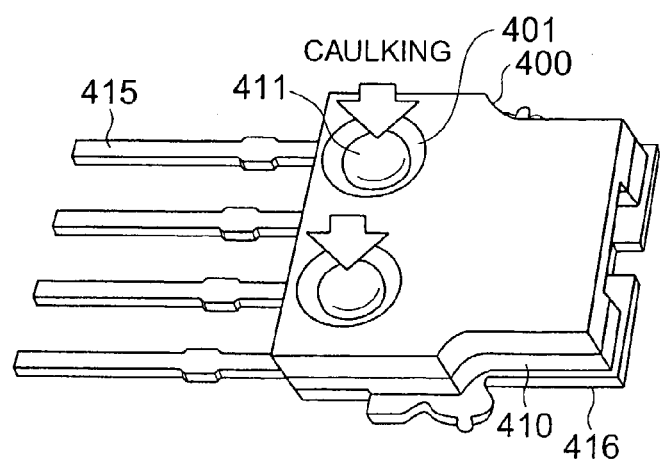

As shown in FIG. 2C, the cover 400 can be accurately fixed to the enclosure 410 if the projections and holes are formed with desired accuracy. When the projections 411 are made of, e.g., PPA, sufficient fixing strength can be obtained by crushing these projections 411 by heating them to about 150° C. to 300° C. As a cover which is not directly heated or processed, it is possible to widely select a material having a relatively low heat resistance or a metal material other than plastic.

When hot caulking is used as described above, the process can be simplified and the material cost can be saved because no adhesive material is used. In addition, there is no adverse effect on characteristics, such as impurity adhesion to the semiconductor laser element or optical system.

Referring to FIGS. 1A to 1C, when a plurality of elements (in this embodiment, the semiconductor laser element 3 and light receiving element) are mounted on the lead frame 1, the number of leads increases. Therefore, the lead frame 1 and the leads 1a to 1c are cut apart.

As shown in FIG. 1A, this apparatus has a narrow front half and wide rear half bounded by the front sections 301 formed in the notches as the reference surfaces in the forward or backward direction of the main beam 8. An insertion hole corresponding to the narrow front half of this semiconductor laser apparatus is formed in a holder of a pickup in which the apparatus is installed. The laser apparatus is installed as it is inserted into this hole.

The installation accuracy of the semiconductor laser apparatus has significant influence on the performance of the pickup head and the like in which the apparatus is installed. In this embodiment as described above, therefore, the side sections 302 of the notches in the lead frame 1 are used as the reference surfaces for positioning in the lateral direction. However, the reference surfaces are not restricted to these notched end faces (sections). The area of the reference surfaces can be increased by using portions other than sections as the reference surfaces by, e.g., bending the end faces.

As described above, those front sections 301 of the notches in the lead frame 1, which are steps produced between the narrow portion and wide portion are used as the reference surfaces for positioning in the forward or backward direction. When this apparatus is inserted into a holder hole, therefore, the apparatus can be positioned in the forward or backward direction because these reference surfaces (front sections 301) abut against the inner surface of the holder. It is also possible to form projections on these positioning reference surfaces, and set the tips of these projections as reference positions. Alternatively, a portion other than the lead frame 1, e.g., a portion of the enclosure 2 can be set as a reference for positioning in the forward or backward direction.

(2) Second Embodiment

Figure 3A:
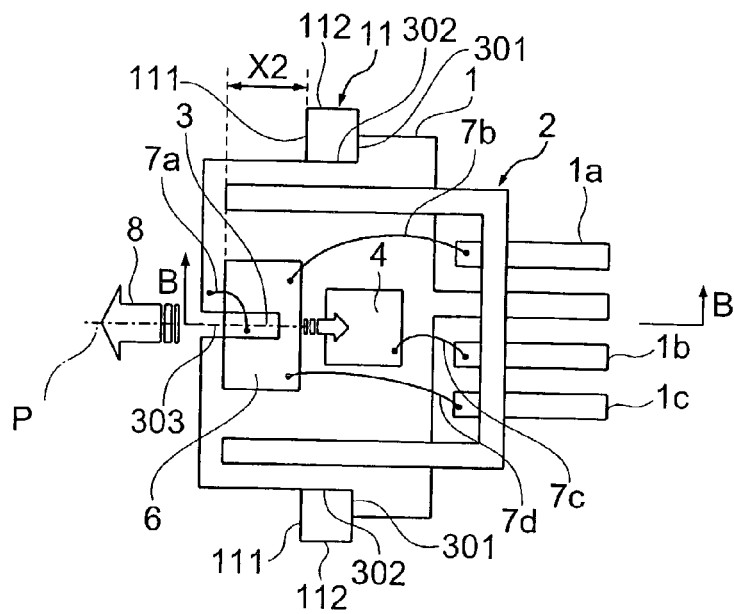
FIGS. 3A, 3B, and 3C are a plan view, longitudinal sectional view, and side view, respectively, showing the arrangement of a semiconductor laser apparatus according to the second embodiment of the present invention.
Figure 3B:
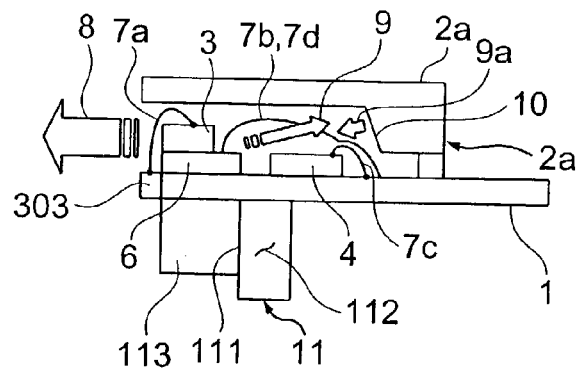
Figure 3C:
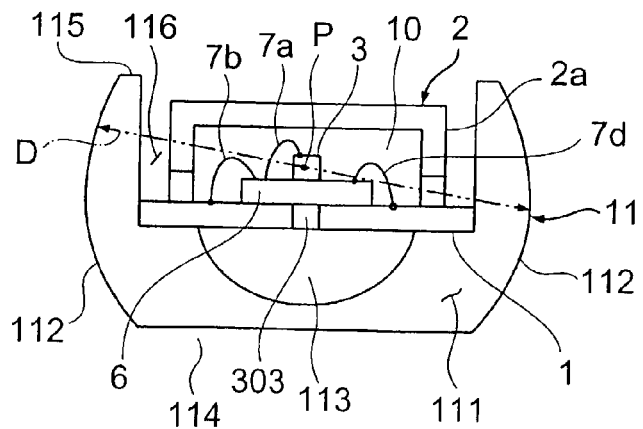

A semiconductor laser apparatus according to the second embodiment of the present invention will be described below. FIGS. 3A to 3C illustrate the arrangement of this semiconductor laser apparatus. FIG. 3A is a plan view showing the state in which a cover 2a of an enclosure 2 of this apparatus is removed. FIG. 3B is a longitudinal sectional view taken along a line A—A in FIG. 3A. FIG. 3C is a left side view. The same reference numerals as in the first embodiment shown in FIGS. 1A to 1C denote the same components in FIGS. 3A to 3C, and a detailed explanation thereof will be omitted.

In this embodiment, a heat sink 11 is added to the apparatus according to the first embodiment. By attaching this heat sink 11 to a lead frame 1, heat generated from a semiconductor laser element 3 can be radiated to the outside more efficiently.

It is also possible to increase the strength when this apparatus is installed in a holder of a pickup head. When the semiconductor laser apparatus shown in FIGS. 4A to 4C is installed in a holder by press fit, those front section 201 and side sections 202 of the lead frame 101, which function as reference surfaces for positioning undergo large pressure and stress. To prevent deformation by such external forces, therefore, the thickness of the lead frame 101 must be increased to some extent, and its material is also largely limited.

By contrast, in this embodiment, assuming that a direction perpendicular to a direction in which a main beam 8 is emitted from the semiconductor laser element 3 is the lateral direction, arcuate side surfaces 112 of the heat sink 11 are used as reference surfaces for positioning in this lateral direction. In addition, a front surface 111 of the heat sink 11 is used as a reference surface in the forward or backward direction of the main beam 8. Accordingly, even when the apparatus is installed in a holder, the large-area surfaces 111 and 112 of the heat sink 11 receive pressure and stress. So, sufficient strength can be ensured without increasing the thickness of the lead frame 1.

Furthermore, in the structure as shown in FIGS. 4A to 4C, a heat sink for improving the heat radiation properties is difficult to attach with high accuracy.

In this embodiment, notches are formed in the lead frame 1 as in the above first embodiment. The heat sink 11 is attached to abut against front sections 301 as reference surfaces for positioning in the forward or backward direction, and side sections 302 as reference surfaces for positioning in the lateral direction, in these notches. Consequently, the heat sink 11 can be easily and accurately attached to the lead frame 1.

To improve the heat radiation properties, a metal material such as a copper- or iron-based material is used as the material of the heat sink 11. However, if no superior heat radiation properties are necessary, another material such as plastic can also be used.

The shape of the heat sink 11 of this embodiment is obtained by linearly cutting a lower end 114 and upper end 115 of a disk having a predetermined thickness. The side surfaces 112 of this heat sink 11 are arcuate as they are formed by portions of a cylindrical surface. A central axis P of the arcs of these side surfaces 112 is positioned near the emission position of the main laser beam 8 from the semiconductor laser element 3, and so set as to be substantially parallel to the emission direction.

A round hole is formed in a holder in which this apparatus is installed, and the apparatus is inserted such that the arcuate side surfaces 112 of the heat sink 11 come in close contact with the inner surface of the round hole. In this manner, the emission direction of the main laser beam 8 is easily and accurately determined. Also, since the apparatus is inserted into a round hole, positioning in a direction perpendicular to the main laser beam 8 can be easily performed by the lower end 114 and upper end 115. It is also readily possible to adjust the rotational direction of the apparatus after it is inserted.

The lower end 114 and upper end 115 of the heat sink 11 are cut to make the semiconductor laser apparatus compact, and allow installation in a low-profile pickup head or the like. Since the apparatus according to the first embodiment described above can be made thin, the apparatus of this embodiment in which the heat sink 11 is added to the apparatus of the first embodiment can also be made thin. Furthermore, the vertical dimension and shape of the heat sink 11 can be freely designed in accordance with the design of a pickup head. However, if the apparatus is to be installed in a normal pickup head which is not a low-profile head, the upper and lower ends of the heat sink 11 need not be cut off.

A notch 116 for accommodating the lead frame 1 and the like is formed in a portion of the heat sink 11. Also, as described above with reference to FIG. 3C, the emission position of the main laser beam 8 from the semiconductor laser element 3 is so set as to be aligned with the central axis P of the arcuate side surfaces 112 of the heat sink 11. This is to allow the beam emission point of the semiconductor laser element 3 to always come to a predetermined position, in order to adjust the rotational direction when this apparatus is installed in a holder of a pickup head. In addition, the front surface 111 of the heat sink 11 is perpendicular to the side surfaces 112, and part or the whole of this surface 111 is a reference surface for positioning in the forward or backward direction of the main beam 8.

In this embodiment, the side surfaces 112 and front surface 111 are directly used as the reference surfaces. However, reference portions can also be additionally formed on these surfaces 111 and 112. For example, it is possible to form projections on the side surfaces 112 and/or the front surface 111, and use the tips of these projections as reference positions. In this case, the apparatus is positioned by abutting these tips of the projections against the inner wall of a hole in a holder.

The heat sink 11 is desirably attached to the lead frame 1 such that this heat sink 11 is thermally cemented to or brought into contact with a portion near the surface, or the surface itself, just behind that portion of the lead frame 1, on which the semiconductor laser element 3 is mounted. This improves the heat radiation properties. In this embodiment, a projection 113 of the heat sink 11 is cemented to the surface just behind the portion on which the semiconductor laser element 3 is mounted. As shown in FIG. 3C, this projection 113 preferably has a dimension not extending to the outside from a diameter D of the arcuate side surfaces 112. Accordingly, the apparatus can be installed in a holder while being kept compact in size.

The heat sink 11 can be fixed to the lead frame 1 by, e.g., solder, silver epoxy, or silver brazing. However, this fixing can also be performed by using an adhesive or grease, or by simple contact bonding, while the heat radiation properties are assured. Consequently, heat generated from the semiconductor laser element 3 is radiated to the outside via the lead frame 1, heat sink 11, and the holder in which this apparatus is installed.

Each of the above embodiments is merely an example and hence does not restrict the present invention. For example, in each of the first and second embodiments described above, a light receiving element is mounted in addition to a semiconductor laser element. However, the present invention is applicable to an apparatus on which no element other than a semiconductor laser element is mounted, or to an apparatus on which another element is mounted in addition to a semiconductor laser element and light receiving element. In addition, the materials of the individual components can be freely selected as needed.

Furthermore, in the second embodiment, reference surfaces serving as references for a semiconductor laser element in the forward or backward direction are formed on the heat sink behind a portion where the semiconductor laser element is mounted. However, depending on the shape or the like of a holder of a pickup head, reference surfaces serving as references in the forward or backward direction can also be formed in substantially the same position in the forward or backward direction as the emission position of the main beam 8 from the semiconductor laser element 3. That is, reference surfaces in the forward or backward direction need only be formed on the heat sink in accordance with the shape or the like of a holder, at substantially the same position as the emission position of the main beam 8 of the semiconductor laser element 3 or after the emission position.

In the semiconductor laser apparatus of the present invention according to each embodiment as has been explained above, the lead frame has reference surfaces serving as references for a semiconductor laser element in the forward or backward direction after a portion where this semiconductor laser element is mounted. Therefore, it is possible to increase the degree of freedom of design for positioning when this apparatus is installed in a holder or the like.

Also, when the apparatus includes a heat sink, this heat sink receives the stress upon installation instead of the lead frame. This eliminates the need to increase the strength of the lead frame, and ensures the strength upon installation without imposing any limitations on the material, thickness, and the like of the lead frame.

What is claimed is:

1. A semiconductor laser apparatus comprising a semiconductor laser element, a lead frame on which said semiconductor laser element is mounted, and an enclosure attached to said lead frame,
   wherein when a direction in which a main beam is emitted from said semiconductor laser element is defined as forward, said lead frame has a reference surface serving as a reference for said semiconductor laser element in a forward or backward direction of the main beam, and the reference surface is provided behind a front surface of said semiconductor laser element emitting the main beam.

2. An apparatus according to claim 1, further comprising a reference surface serving as a reference for said semiconductor laser element in a lateral direction, when a direction perpendicular to the longitudinal direction and parallel to a surface of said lead frame, on which said semiconductor laser element is mounted is defined as the lateral direction.

3. An apparatus according to claim 2, wherein said enclosure has a window for extracting the beam emitted from said semiconductor laser element forward.

4. An apparatus according to claim 2, wherein the reference surface serving as the reference in the forward or backward direction of the main beam is formed in a notch of said lead frame.

5. An apparatus according to claim 2, wherein the reference surface serving as the reference in the lateral direction is a side surface of said lead frame, and the side surface is perpendicular to the surface of said lead frame, on which said semiconductor laser element is mounted, and is formed before the reference surface serving as the reference in the forward or backward direction of the main beam.

6. An apparatus according to claim 1, wherein when a direction perpendicular to a surface of said lead frame, on which said semiconductor laser element is mounted is defined as a vertical direction, and the mounting surface of said semiconductor laser element is the top surface of said lead frame, the bottom surface of said lead frame is used as a reference for said semiconductor laser element in the vertical direction.

7. An apparatus according to claim 6, wherein the bottom surface of said lead frame is exposed from said enclosure.

8. An apparatus according to claim 6, wherein said enclosure has a window for extracting the beam emitted from said semiconductor laser element forward.

9. An apparatus according to claim 6, wherein the reference surface serving as the reference in the forward or backward direction of the main beam is formed in a notch of said lead frame.

10. A semiconductor laser apparatus comprising a semiconductor laser element, a lead frame on which said semiconductor laser element is mounted, and an enclosure and heat sink attached to said lead frame,
    wherein when a direction in which a main beam is emitted from said semiconductor laser element is defined as forward, said heat sink has a reference surface serving as a reference for said semiconductor laser element in the forward or backward direction of the main beam, and the reference surface is provided behind a front surface of said semiconductor laser element emitting the main beam and, when a direction perpendicular to the forward or backward direction of the main beam and parallel to a surface of said lead frame on which said semiconductor laser element is mounted is defined as a lateral direction, said heat sink has a reference surface serving as a reference for said semiconductor laser element in the lateral direction.

11. An apparatus according to claim 10, wherein
    a side surface of said heat sink parallel to the forward or backward direction of the main beam has an arcuate shape and corresponds to the reference surface serving as the reference for said semiconductor laser element in the lateral direction,
    a surface of said heat sink perpendicular to the forward or backward direction of the main beam corresponds to the reference surface serving as the reference for said semiconductor laser element in the longitudinal direction,
    a central axis of the arcuate shape of the side surface is substantially parallel to the emission direction of the main beam from said semiconductor laser element, and
    when that surface of said lead frame, on which said semiconductor laser element is mounted is defined as a top surface of said lead frame, on a bottom surface of said lead frame a portion corresponding to the back side of the mounting position of said semiconductor laser element or a nearby portion of the portion corresponding to the back side is in contact with said heat sink.

12. An apparatus according to claim 11, wherein said heat sink has a projection before the reference surface serving as the reference in the forward or backward direction of the main beam, and on the bottom surface of said lead frame this projection is in contact with the portion corresponding to the back side of the mounting position of said semiconductor laser element.

13. An apparatus according to claim 11, wherein said heat sink has upper and lower surfaces parallel to the central axis of the arcuate shape of the side surface, and separated by a distance smaller than the diameter of the arc.

14. An apparatus according to claim 10, wherein said heat sink has upper and lower surfaces parallel to the central axis of the arcuate shape of the side surface, and separated by a distance smaller than a diameter of the arc.

15. An apparatus according to claim 10, wherein
    a side surface of said heat sink parallel to the longitudinal direction has an arcuate shape and corresponds to the reference surface serving as the reference for said semiconductor laser element in the lateral direction,
    a surface of said heat sink perpendicular to the longitudinal direction corresponds to the reference surface serving as the reference for said semiconductor laser element in the forward or backward direction of the main beam,
    a central axis of the arcuate shape of the side surface is substantially parallel to the emission direction of the main beam from said semiconductor laser element, and when that surface of said lead frame, on which said semiconductor laser element is mounted is defined as a top surface of said lead frame, on a bottom surface of said lead frame a portion corresponding to the back side of the mounting position of said semiconductor laser element or a nearby portion of the portion corresponding to the back side is in contact with said heat sink.

16. An apparatus according to claim 15, wherein said heat sink has a projection before the reference surface serving as the reference in the forward or backward direction of the main beam, and on the bottom surface of said lead frame this projection is in contact with the portion corresponding to the back side of the mounting position of said semiconductor laser element.

17. An apparatus according to claim 15, wherein said heat sink has upper and lower surfaces parallel to the central axis of the arcuate shape of the side surface, and separated by a distance smaller than the diameter of the arc.

18. An apparatus according to claim 10, wherein said heat sink has upper and lower surfaces parallel to the central axis of the arc of the side surface, and separated by a distance smaller than the diameter of the arc.

19. An apparatus according to claim 10, wherein a portion of said semiconductor laser apparatus before the reference surface serving as the reference in the forward or backward direction of the main beam has a shape and dimension within the range of a cylinder having the same central axis and same diameter as those of the arc of the side surface.

20. A semiconductor laser apparatus comprising a semiconductor laser element, a lead frame on which said semiconductor laser element is mounted, and an enclosure attached to said lead frame,
   wherein when a direction in which a main beam is emitted from said semiconductor laser element is defined as forward,
   said lead frame has notches having front sections located behind a front surface of said semiconductor laser element emitting the main beam, the front sections of said notches serve as a reference for said semiconductor laser element in a forward or backward direction of the main beam when said semiconductor laser apparatus is installed in a holder.

21. An apparatus according to claim 20, wherein the front sections of said notches are parallel to the front surface of said semiconductor laser element emitting the main beam.

22. An apparatus according to claim 20, wherein said notches are not covered with said enclosure.

* * * * *